United States Patent [19]

Freedman

[11] 3,849,635

[45] Nov. 19, 1974

[54] HIGH SPEED PROGRAMMABLE COUNTER

[75] Inventor: David Daniel Freedman, Cinnaminson, N.J.

[73] Assignee: RCA Corporation, New York, N.Y.

[22] Filed: Apr. 12, 1973

[21] Appl. No.: 350,605

[52] U.S. Cl. ...... 235/92 CC, 235/92 R, 235/92 SH, 235/92 PE

[51] Int. Cl. ............................................ G06m 1/28

[58] Field of Search ....... 235/92 CC, 92 SH, 92 PE, 235/92 EC, 92 EA

[56] References Cited

UNITED STATES PATENTS

| | | | |
|---|---|---|---|
| 3,644,718 | 2/1972 | Osborne | 235/92 DN |
| 3,716,703 | 2/1973 | Gordon | 235/92 EC |
| 3,740,532 | 6/1973 | Esch | 235/92 CC |
| 3,764,790 | 10/1973 | Long | 235/92 PE |

*Primary Examiner*—Gareth D. Shaw
*Assistant Examiner*—Robert F. Gnuse
*Attorney, Agent, or Firm*—Edward J. Norton; Carl M. Wright

[57] ABSTRACT

High speed programmable counter wherein the final *n* counts of a cycle are counted in an auxiliary counter to provide time for presetting the stages in the programmable counter.

6 Claims, 3 Drawing Figures

HIGH SPEED PROGRAMMABLE COUNTER

BACKGROUND OF THE INVENTION

It is advantageous to use digital circuits for frequency division because of circuit modularity and accuracy. Digital circuits, however, are high frequency limited.

Digital frequency division is most efficient when the division factor (divisor) is an integral power of the division circuit's radix because the counting stages can be cascaded and the output signal taken from the last stage. For illustrative purposes, the radix will be assumed to be two, because binary digital circuits are most commonly used. It will be apparent that the techniques discussed herein can be applied to counters of any radix.

A useful employment of digital dividers is found in frequency synthesizers such as those used in radio receivers. (See, for example, Stinehelfer and Nichols, "A Digital Frequency Synthesizer For An AM and FM Receiver," *IEEE Transactions on Broadcast and TV Receivers*, Vol. BTR–15, No. 3, Oct. 1969, pp. 235–243.)

Basically, a digital frequency synthesizer includes a voltage controlled oscillator (VCO), a reference oscillator that is accurately controlled to a frequency equal to the desired channel spacing (frequency increments), a frequency divider for dividing the VCO output frequency, a phase comparator responsive to the reference oscillator and frequency divider output signals, and a loop filter for applying the phase comparator output to the VCO. This type of frequency synthesizer is usually referred to as including a phase-locked loop.

If the digital frequency divider, usually referred to as the program counter, produces an output signal in response to every $N$th input pulse, then it divides the input frequency by $N$. The output frequency of the *VCO* will, therefore, be locked to $N$ times the reference frequency, i.e., $$F_{VCO} = N \times F_{REF}. \tag{1}$$

The reference frequency is determined by the desired *VCO* frequency increments. For example, in an FM receiver, the channels are 200 Kc apart. The intermediate frequency usually used is 10.7 Mc, so that the local oscillator operates 10.7 Mc over the carrier frequency, which in commercial FM extends from 88 to 108 Mc. The *VCO* output frequency must vary in 200 Kc increments from 98.8 Mc to 118.8 Mc. To tune to the middle of the lowest channel, $N$ must equal 494 with a reference frequency of 200 Kc. If $N$ is not an integral power of the radix, then the frequency divider must be programmed so that it produces an output signal for every $N$th input pulse.

One method of programming the divider is to decode the value in the counter and provide an output signal from the decoder when the desired count value is reached. The output signal also resets the counter to an initial value of zero.

Another method of programming the counter is to set the counter value to the complement of $N$ so that the counter counts to all ones in $N$ counts. This method has the advantage that the signal for setting the counter can be taken from switches set by the user.

In the FM example above, an oscillator frequency of 118.8 Mc requires a maximum count value of 594. Therefore, the counter must have at least 10 stages ($2^{10} = 1{,}024$). The value 494 (corresponding to the lowest channel) expressed in binary numbers is 0111101110, which has a ones complement of 1000010001. Therefore, if the $2^0$, $2^4$, and $2^9$ stages of the counter are set, the counter will count to all ones and produce an output signal every 494 input pulses. When compared to the 200 Kc reference frequency, an error signal will be produced that will lock the *VCO* on 494 × 200 Kc, or 98.8 Mc.

To tune to the second channel, the counter's initial value is decreased by one, so that an output signal is produced every 495th input pulse. Therefore, from equation (1), $F_{VCO} = 495 \times 200$ Kc $= 99$ Mc, which is the center of the second channel plus the intermediate frequency of 10.7 Mc.

The cost of a counter stage varies proportionally with the speed at which it can operate. Counters are commercially available that operate up to 320 Mc, but are more expensive than those that operate at 20 Mc. It is economically desirable to use the high speed units in only the first four stages. Since $2^4$ is equal to 16, the output frequency from the fourth stage is one-sixteenth of the input frequency to the first stage. Consequently, if the first four stages are capable of counting at rates up to 320 Mc, the output to the fifth stage will be no higher than 20 Mc. The first four stages in this instance are usually called a prescaler counter.

The technique of using a prescaler counter permits use of the phase locked loop with *VCO* frequencies up to 320 Mc or higher, as faster counter stages become available.

Inserting a prescaler counter in the front of the divider, i.e., the program counter, reduces the reference frequency by a factor equal to the count in the prescaler. Prescaler counts are usually 16 or 10, 10 being the most commonly used factor. The value of $N$ in equation (1) becomes $N_{PS} + N_{PC}$, where $N_{PS}$ is the prescaler factor and $N_{PC}$ is the program count factor. Equation (1) can be expressed as $$F_{VCO} = (N_{PS} + N_{PC}) \times f_{REF}. \tag{2}$$

This requires a change in the reference frequency $F_{REF}$, which must equal the desired channel spacing divided by the prescaler count factor. That is, $F_{REF} = \Delta F/N_{PS}$. In the example above, if $N_{PS}$ is 10, and $\Delta F$ is 200 Kc, then the reference frequency will be 20 Kc.

It is, however, desirable to have the reference frequency as high as possible. It cannot be higher than the channel spacing, so it is most advantageous to keep the reference frequency at this maximum. This results in a fast phase lock and makes the loop less susceptible to spurious output signals from the *VCO* by moving such signals further from the *VCO* fundamental frequency.

Including the prescaler counter in the program counter is not feasible because at high counting speeds, the faster (lower order) stages cannot respond in the time required to set in the number between input pulses. At 320 Mc, for example, the time between input pulses (assuming a 50 percent duty cycle) is only 1.5625 nanoseconds.

One method of using the maximum reference frequency with a prescaler is called pulse swallowing (see Stinehelfer and Nichols, op. cit.). A prescaler is used, which selectively counts in one of two modulos. The *VCO* frequency is divided by the upper modulo ($UM$) until a predetermined number ($N_S$) of output pulses have been produced. Thereafter, the input pulses are divided by the lower modulo ($LM$) until the program counter produces an output pulse. The number of divisions by the upper modulo is determined by a swallow counter, $N_S$, so that the total count is $$N = UM \times N_S + LM \times N_{LM} \quad (3)$$

where $N_{LM}$ is the number of divisions by the lower modulo. The program counter has a total count given by $$N_{PC} = N_S + N_{LM} \quad (4)$$

and $$UM = LM + 1 \quad (5)$$

Substituting equations (4) and (5) into equation (3) gives $$N = LM \times N_{PC} + N_S \quad (6)$$

which shows that the total count can be increased by one by increasing the swallow count, $N_S$, by one. If $LM$ is taken as 10, $N_S$ can be made adjustable from zero to nine to provide for setting units, and $N_{PC}$ can be varied for tens, hundreds and on up.

This invention relates to a high speed programmable counter that can be set directly so that no prescaling counter is required.

BRIEF DESCRIPTION OF THE INVENTION

A high speed frequency divider for producing an output signal for every $k$th input pulse comprises two counters, the first counter counting the input signals when enabled. The second counter counts the input signals modulo $n$ when enabled, and produces the output signal. When the first counter has counted $k - n$ input signals, the second counter is enabled and the first counter is disabled. The count value in the first counter is modified when the second counter has counted less than $n$ input signals. When the second counter has counted $n$ input signals, the output signal is produced, which enables the first counter and disables the second counter.

DETAILED DESCRIPTION OF THE INVENTION

Figure 1:
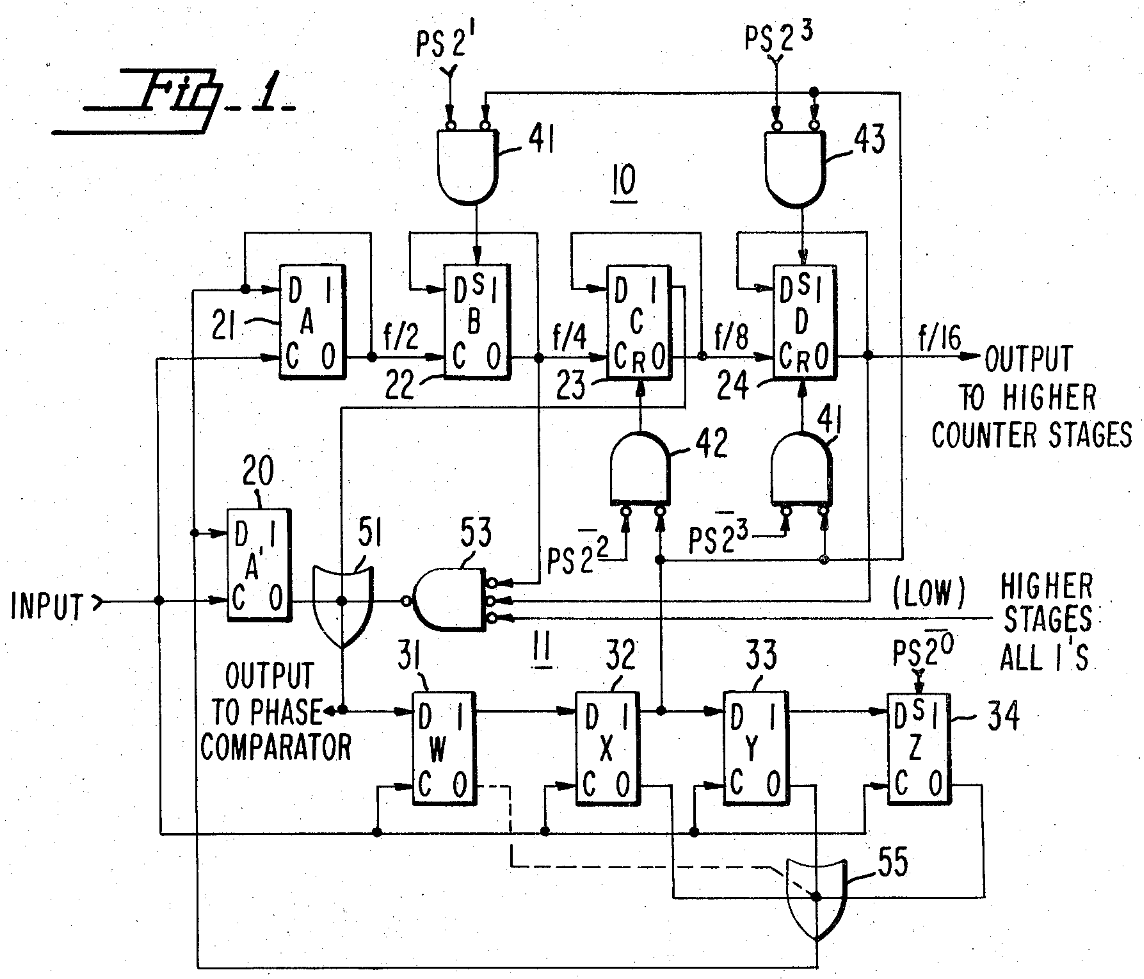
FIG. 1 is a logic diagram of a preferred embodiment of the first four stages of a programmable counter according to the invention.

For purposes of illustration, the counter stages of the programmable counter 10 are shown in FIG. 1 as D-type flip-flops. Each stage has a clock input terminal (C), a data input terminal (D), and two complementary output terminals. If the D-input signal is high at the rising edge of the clock pulse, the flip-flop will be set, i.e., the "1" output signal will be high and the "0" output signal will be low. If the D-input signal is low (0) at the rising edge of the clock pulse, the flip-flop will be reset so that the "1" output signal will be low (0) and the "0" output signal will be high (1). The data signal can change during the period between the leading edges of successive clock pulses without changing the state of the flip-flop. (The symbols "0" and "1" are used to distinguish the flip-flop terminals from the symbols 0 and 1 which represent a low voltage and a high voltage, respectively.)

By coupling the "0" output signal to the D-input terminal, a triggerable flip-flop can be constructed. A triggerable flip-flop is herein meant to be one which changes state at every clock pulse. That is, if the flip-flop is set, it will be reset by the next clock pulse; if it is reset, it will be set by the next clock pulse.

When the D-type flip-flop is in the reset state, the "0" output signal is high. Coupling this signal to the D-input terminal will cause the flip-flop to be set by the next clock pulse. When the flip-flop is set, the "0" output signal will be low, and being coupled to the D-input terminal will cause the flip-flop to be reset by the next clock pulse. Therefore, the state of the flip-flops 21, 22, 23 and 24 in FIG. 1 will change state at each successive clock pulse applied thereto.

The clock signal for the A flip-flop 21 is the input signal source. The clock pulse for the B flip-flop 22 is the "0" output signal from the A flip-flop 21. The A flip-flop 21 changes state with every clock pulse so that the output signals are changing at one-half the rate of the input signals. The B flip-flop 22 will, therefore, produce an output signal at one-half the rate of the A flip-flop 21, or one-fourth the input rate. Cascading stages divides the input frequency by successive powers of two, the binary radix. This type of counter can be called a radix counter since each stage represents a power of the radix. The C flip-flop divides the input signal frequency by eight, and the D flip-flop 24 by 16. An A' flip-flop 20 parallels the A flip-flop 21, and has the same inputs. It is provided to permit the A flip-flop's (21) "0" output signal to be wire-ORed without affecting the operation of the A flip-flop 21. If the A flip-flop 21 is a type having two emitter follower outputs that are independent from each other, then the second "0" output of the A flip-flop can be used instead of the "0" output of the A' flip-flop 20.

It is desirable to wire-OR certain of the output signals to provide a logic signal without any gate delay time.

An auxiliary counter 11, comprising four flip-flops 31, 32, 33 and 34 is a shift register type counter. That is, the same clock pulse (or advance pulse) is applied to each stage and the input signal of each stage except the first is the "1" output signal from the preceding stage. The input signal (sometimes called the shift input) for the first stage will be discussed in more detail in the description of circuit operation.

Four NOR gates 41, 42, 43 and 44, are provided to modify the states of the stages in the programmable counter 10. When both input signals of the NOR gate 41 are low (0), its output signal will be high (1), setting the B flip-flop 22. Likewise, when all the input signals of the NOR gate 42 are low (0), its high (1) output signal will reset the C flip-flop 23. Resetting the C flip-flop 23 will cause the D flip-flop 24 to be triggered. Therefore, two NOR gates 43 and 44 are provided to insure that the D flip-flop 24 is preset to the correct value. The values of the B and C flip-flops 22 and 23 are predictable and require only one gate to change the state if the preset value is different from the predicted state. The states of the D flip-flop 24 and all higher stages are not predictable and require two gates.

The A flip-flop 21 is not preset because of certain conditions that will be explained in the description of the circuit operation. In effect, the count value of the auxiliary counter is modified by holding the Z flip-flop 34 set when the least significant digit $2^0$ is not to be preset. In the preferred embodiment of the invention shown in FIG. 1, the wired-OR gate 51 produces a high output signal when at least one of the input signals is high. Stated another way, its output signal is low only when all the input signals are low.

The negative AND gate 53 operates according to the same rules as the wired-OR gate 51, in that the output signal is low only when all the input signals are low. The AND gate 53 isolates the input signals from each other whereas the wired-OR gate 51 does not.

One input signal of the AND gate 53 indicates that all the higher order stages are set. Such a signal can be obtained using a NAND gate (not shown) with a different input terminal coupled to each "1" output terminal of every higher order stage. When all the higher order stages are set, all the output signals coupled to the input terminals of the NAND gate will be high, causing the output signal to be low. The output signal of the NAND gate provides one of the input signals to tHe NAND gate 53.

Another input signal to the AND gate 53 is the "0" output signal from the D flip-flop 24, which will be low when the D flip-flop is set. Similarly, the third input of the AND gate 53 will be low when the B flip-flop is set.

When the B flip-flop 22, the D flip-flop 24, and all higher stages of the counter 10 are set, the output signal of the AND gate 53 will be low.

The output signal of the AND gate 53 is one of the three input signals to the OR gate 51. Another input signal to the OR gate 51 is the "1" output signal of the C flip-flop 23. The third input signal to the OR gate 51 is the "0" output signal of the A' flip-flop 20, which is the same as the "0" output signal of the A flip-flop 21. Therefore, the output signal of the OR gate 51 will be low when all the stages of the counter 10 except the C flip-flop 23, are set. Under all other conditions, the output signal of the OR gate 51 will be high.

The input signal to the shift register 11 is the output of the OR gate 51. At successive clock pulses, the signal at the D input terminal of the first stage 31 is propagated through the shift register. The "0" output signals of all the stages of the auxiliary counter 11 are wire-ORed by the OR gate 55. Connection of the W flip-flop's "0" output signal to the OR gate 55 is not necessary as indicated by the dotted line, because the A flip-flop 21 will be set at the same time as the W flip-flop 31.

The D input and the "0" output signals of the A flip-flop 21 are also coupled to the OR gate 55. The output signal of the OR gate 55 is the data input signal to the A flip-flop 21 and the A' flip-flop 20. Consequently, when any "0" output signal of the X flip-flop 32, the Y flip-flop 33, the Z flip-flop 34, the A flip-flop 21, or optionally, the W flip-flop 31, is high, the A flip-flop 21 and the A' flip-flop 20 will be set by the next clock pulse.

When the stages of the auxiliary counter 11 are all set, the output signal of the OR gate 55, and consequently the next state of the A flip-flop 21, is determined by the present state of the A flip-flop 21. That is, when all stages of the auxiliary counter 11 are set, the A flip-flop 21 functions as a triggerable flip-flop. Thus, when all stages of the auxiliary counter are set, the programmable counter 10 operates in its usual manner.

The W flip-flop 31 of the auxiliary counter 11 will be reset by the clock pulse that occurs after the following conditions are arrived at:

A flip-flop 21 (or A' flip flop 20) set;
B flip-flop 22 set;
C flip-flop 23 reset;
D flip-flop 24 set; and
all higher order stages set.

From the above, it can be seen that all the stages in the auxiliary counter 11 will be set until the counter 10 has counted to a value that is within a count of five from being zero. That is, when the value in the counter 10 is 1 . . . 11011, a 0 will be started through the auxiliary counter 11 by the output signal of the OR gate 51.

The output signal of the OR gate 51 is the counter output signal. An output signal from the counter can also be taken from the signal that indicates that all the higher order stages are set, but this would be a wide pulse that would make the operation of the comparator (to which it would be connected in a phase locked loop) less definite. The operation of the counter circuit of FIG. 1 can be more clearly understood by reference to the timing diagram shown in FIG. 2.

Figure 2:
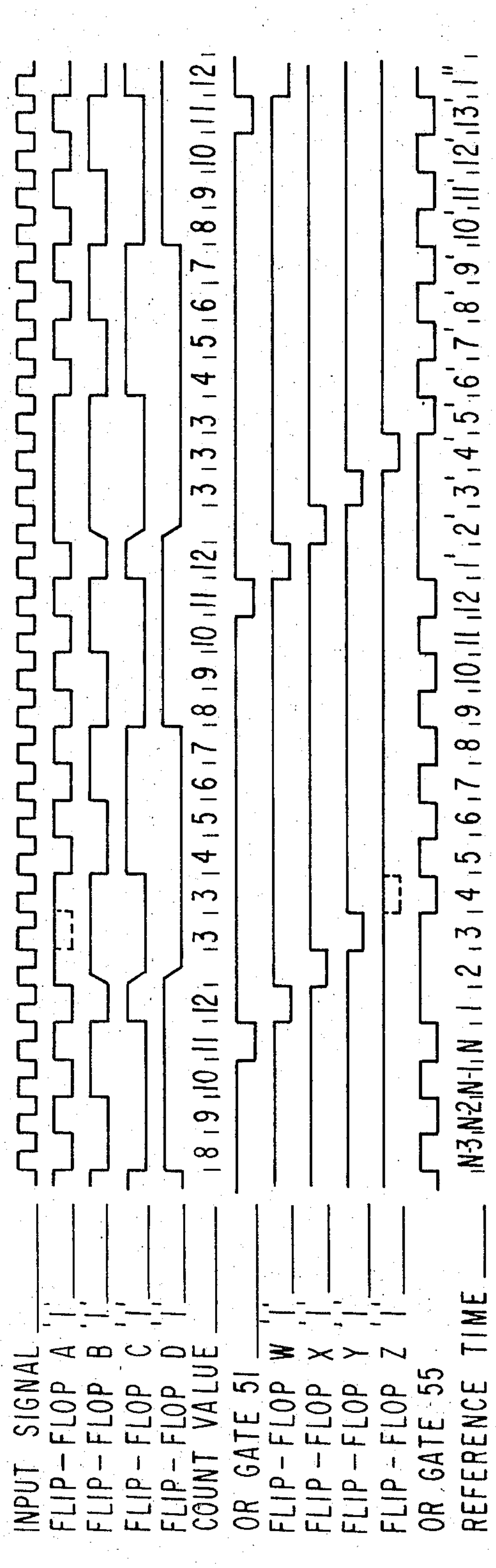
FIG. 2 is a timing diagram showing idealized wave forms at various points in the circuit of FIG. 1.

The top line of FIG. 2 represents the input signal. It is shown as a periodic square waveform, but it is not necessary that it be a regular waveform. Usually, a squaring circuit will be used if the input signal to be counted has a slow rise time.

The bottom line of FIG. 2 shows the reference times used in the detailed description of the operation of the circuit of FIG. 1. Each reference circuit corresponds to a period of the input signal, i.e., the rising edge of an input signal begins each successive reference time period.

The timing begins at reference time $N$–3, where $N$ is the complement of the divisor previously set into the counter. At reference time $N$–3, the count value stored in the count value 10 is eight, as shown in the sixth line of FIG. 2. At reference time $N$–2, the count value in the counter 10 is incremented to nine and at reference time $N$–1, to 10. The count values are taken from the "1" output signals of the stages of the counter 10 whose signals are shown in the second through fifth lines of FIG. 2.

At reference time $N$, the count value is 11, which corresponds to 1011 in the counter. Assuming for the present that there are no higher order stages in the counter, a count value of 11 produces an output signal from the OR gate 51 as previously described. The output signal of the OR gate 51 is shown in the seventh line of FIG. 2. The low output signal of the OR gate 51 corresponds to the $N$th reference time.

The next input signal, corresponding to reference time 1, increments the count value to 12. It also shifts a 0 signal from the OR gate 51 into the W flip-flop 31.

This, in turn, causes the output signal of the OR gate 55, which was following the "0" output signal of the A flip-flop 21, to go high. The conditions keeping the output signal of the OR gate 51 low, viz, a count value of 11, are removed so that the signal goes high.

The next input signal, corresponding to reference time 2, shifts the 0 signal from the W flip-flop 31 into the X flip-flop 32, and the 1 output signal from the OR gate 51 into the W flip-flop 31. The 0 value in the X flip-flop 32 causes the "1" output signal to go low, which enables the NOR gates 41, 42, 43 and 44. The other inputs to the NOR gates define the initial count value, which is the ones complement of $N$, the divisor value. The $2^0$ value controls the Z flip-flop 34 in a manner to be described below.

For purposes of illustration, the circuit timing for a divisor of 12 will be explained, followed by an explanation for a divisor of 13. The illustration of both an even and an odd divisor will make the circuit operation more clear.

The one's complement of 12 (1100) is 3 (0011). Therefore, in FIG. 2 at reference time 2, the value of 3 is set into the counter stages. The count value shown in the sixth line is indeterminate because the values are changing. By reference time 3, it is assumed that the counter stages have stabilized although the stages need not reach stability until about half way through reference time 4.

At reference time 3, the 0 value in the X flip-flop 32 is shifted to the Y flip-flop 33. During the reference times 1 through 3, the A flip-flop 21 is held set by the output signal of the OR gate 55. Holding the A flip-flop set inhibits the operation of the counter. At reference time 4, the 0 value in the Y flip-flop 33 should be shifted into the Z flip-flop 34 but the Z flip-flop is held set by the $2^0$ value from the input switches. A dotted line on the 11th line of FIG. 2 shows where the 0 value in the Z flip-flop would occur if it were not held high by the $2^0$ value.

At reference time 5, the signal holding the A flip-flop set is removed and the counter operates in the usual way. The count value reaches 11 at reference time 12, and produces an output signal from the OR gate 51. This corresponds to an output signal for every 12 input signals during repetitive operation. It will be assumed, however, that during the count the input switches were changed to indicate a divisor of 13. At reference time 2', the complement of 13 (1101) is set into the counter. The complement value is 2 (0010) but the A flip-flop 21 is being held set so that 3 (0011) is the value actually set into the counter. The $2^0$ signal does not hold Z flip-flop 34 set, however, so that the A flip-flop 21 is held set for an extra input signal period, i.e., through reference time 5'.

Thus, applying the $2^0$ switch signal to the Z flip-flop 34 makes it possible to enter odd or even divisors (determined by $2^0$), even though the A flip-flop is held set during the counter set up time.

The timing diagram of FIG. 2 would be the same for a counter having higher order stages, except that the count value of 11 in the last four stages would occur several times before an output signal would be produced by the OR gate 51. During the count, the counter value would increment to a value of 15 to produce a trigger signal to the next high order stage (and reset the first four stages to 0) until all the higher order stages were set.

With all the higher order stages set, a count value of 11 would produce an output signal from the OR gate 51 and a sequence the same as depicted by the timing diagram of FIG. 2 would occur.

The higher order stages could be set to the initial value by the "1" output signal of the X flip-flop 32, as explained earlier or by some other method. For example, the NAND gate previously described for decoding the higher order stages all set could be used to set a flip-flop, the output of which would supply the signal assumed to be supplied in the foregoing description by the NAND gate. The output of the flip-flop could be used to set the complement of $N$ into the higher order stages, which might be slower acting then the four lower order stages. The negative-going output signal from the X flip-flop 32 could be used to reset the flip-flop.

In FIG. 1, the A' flip-flop 20 could have a "0" output signal like that shown for the output signal of the OR gate 51. The use of the A' flip flop 20 permits the use of a wired-OR gate 51 that eliminates the propagation delay present in a gate using isolation elements such as diodes and transistors.

Figure 3:
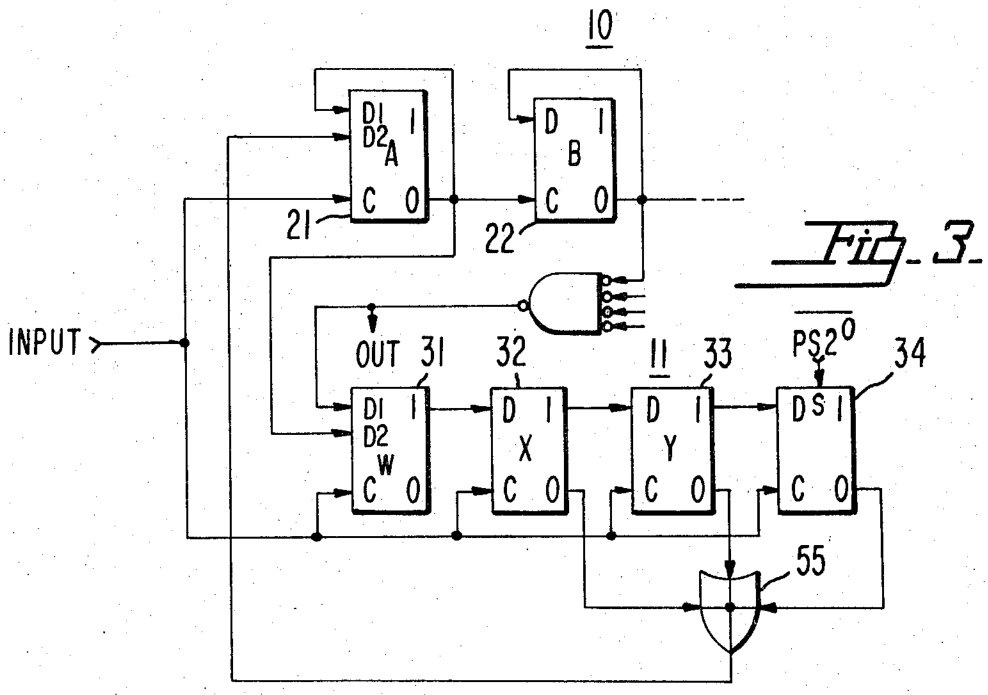
FIG. 3 is a logic diagram of an alternate embodiment of the first stages.

FIG. 3 shows an embodiment using flip-flops with multiple inputs such as the commercially available MC 1690. The principle of operation of the circuit in FIG. 3 is similar to that of the circuit in FIG. 1. Other arrangements are possible using flip-flops with multiple outputs.

Various changes in details and arrangements of parts which have been described and illustrated in order to explain the nature of the invention may be made by those skilled in the art within the principle and scope of the invention as expressed in the appended claims.

What is claimed is:

1. A high speed frequency divider responsive to a source of input signals for producing an output signal for every $k$th input signal, where $k$ is a selectively defined integer, comprising:

- a first counter for counting when enabled said input signals;
- a second counter of modulo-$n$ for counting when enabled said input signals and producing the output signal when $n$ signals have been counted;
- means responsive to a count value of $k$—$n$ in the first counter for enabling the second counter and disabling the first counter;
- means responsive to a count value less than $n$ in the second counter for modifying the count value in the first counter; and
- means responsive to the output signal for enabling the first counter and disabling the second counter.

2. The invention as claimed in claim 1 wherein the count value in the first counter is modified to a value determined by a selected value of $k$; and further including means for changing said second counter to modulo—($n$—1) when the value of $k$ is even.

3. The invention as claimed in claim 2 wherein the second counter is a shift register counter and said modulo changing means disables the last stage of the shift register.

4. A high speed programmable counter comprising the combination of a source of input signals to be counted;

a first counter for counting, when enabled, said input signals and producing an output signal when $j$ signals have been counted, where $j$ is a selectable integer within the count range of the first counter;

a second counter for counting, when enabled, said input signals, producing first output signals when $k-n$ signals have been counted, and producing a second output signal when $k$ signals have been counted, where $k$ and $n$ are predetermined integers;

means responsive to the first counter for enabling the second counter when the value in the first counter is $j-k$;

means responsive to the second counter for disabling the first counter when the second counter is enabled;

means responsive to the first output signal of the second counter for modifying the count value in the first counter;

means responsive to the second counter for enabling the first counter and disabling the second counter when the count value of the second counter is $k$.

5. The combination comprising:

a plurality of counter stage means cascaded to form a radix counter, said counter having an input;

a plurality of logic gate means coupled to the counter stage means for setting a selected value into the radix counter;

a plurality of shift register means coupled to form a shift register, said shift register having a shift input and an advance input;

a source of signals to be counted;

means for coupling the signal source to the input of the radix counter and to the advance input of the shift register;

means responsive to the value in the radix counter for applying a first class of signal to the shift input when the value in the radix counter is a first value and for applying a second class of signal to the shift input when the value in the radix counter is a second value;

means responsive to the shift register for disabling the radix counter when any shift register means contains a first class of signal; and means responsive to a first class of signal in a certain shift register means for enabling the plurality of logic gate means.

6. The invention as claimed in claim 5 including means for holding a second class of signal in the last shift register means when an even value is set into the radix counter.

* * * * *